(12) United States Patent
Tsukui et al.

(10) Patent No.: US 6,432,807 B1
(45) Date of Patent: Aug. 13, 2002

(54) METHOD OF FORMING SOLDER BUMPS ON A SEMICONDUCTOR DEVICE USING BUMP TRANSFER PLATE

(75) Inventors: Hiroyuki Tsukui; Chikara Yamashita; Tetsuya Tao, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/590,515

(22) Filed: Jun. 9, 2000

(30) Foreign Application Priority Data

Jun. 10, 1999 (JP) .......................................... 11-163967

(51) Int. Cl.[7] .............................................. H01L 21/44
(52) U.S. Cl. .......................................... 438/613; 438/616
(58) Field of Search ................................ 438/613, 108, 438/612, 615, 616

(56) References Cited

U.S. PATENT DOCUMENTS 5,456,003 A * 10/1995 Yamamoto et al. ............ 29/840
6,165,885 A * 12/2000 Gaynes et al. ............... 438/612

FOREIGN PATENT DOCUMENTS

| JP | 07-045618 | 2/1995 |
|---|---|---|
| JP | 07-245309 | 9/1995 |
| JP | 07-263450 | 10/1995 |
| JP | 07-307341 | 11/1995 |
| JP | 8-8258 A | * 1/1996 |
| JP | 08-008258 | 1/1996 |
| JP | 08-078419 | 3/1996 |
| JP | 09-017794 | 1/1997 |
| JP | 09-148330 | 6/1997 |
| JP | 09-237963 | 9/1997 |
| JP | 09-275105 | 10/1997 |
| JP | 10-098257 | 4/1998 |
| JP | 10-163213 | 6/1998 |

* cited by examiner

Primary Examiner—Michael J. Sherry
Assistant Examiner—Evan Pert
(74) Attorney, Agent, or Firm—Scully, Scott, Murphy & Presser

(57) ABSTRACT

A bump formation plate is provided with a base and solder bumps formed on the base. The top portion of the solder bump inclines from the center thereof to the periphery thereof. A contact surface of the solder bump with the base may be flat. The base is made of, for example, aluminum or stainless steel.

4 Claims, 22 Drawing Sheets

METHOD OF FORMING SOLDER BUMPS ON A SEMICONDUCTOR DEVICE USING BUMP TRANSFER PLATE

BACKGROUND OF THE INVENTION

1. Field of the Invention

The present invention relates to a bump transfer plate used for a semiconductor package and the like, a manufacturing method of the bump transfer plate, a manufacturing method of a semiconductor device with the bump transfer plate, and the semiconductor device manufactured by the method, and more specifically to a bump transfer plate with high reliability, a manufacturing method thereof, a manufacturing method of a semiconductor device with the bump transfer plate, and the semiconductor device manufactured by the method.

2. Description of Related Art

Recently, new types of semiconductor devices have been successively developed to meet the demands of high functionality, miniaturization and lightening, and the speeding up of electronic equipment. For example, size reduction and width reduction are achieved by using bumps of solder or the like for external terminals in a semiconductor device that adopts a package such as Ball-Grid-Array or Chip-Size-Package.

Such bumps are used to electrically connect an electrode formed in a semiconductor element with a wiring pattern of a package to each other, and mount the semiconductor element on a printed board. A transfer method, in which bumps are formed on electrodes formed in a semiconductor element by transfer can be mentioned as one of the methods of forming bumps. In the transfer method, bump formation materials such as solder are first formed on a base so as to meet the arrangement of the electrodes of a semiconductor element. Thereafter, the bump formation materials and the electrodes of the semiconductor element are caused to coincide with each other to adjust each position, and the base and the semiconductor element are overlapped. The bump formation materials are transferred to the electrodes of the semiconductor element, and thereby bumps are formed on the semiconductor element. FIG. 1A through FIG. 1C show a bump transfer plate for the conventional transfer method. FIG. 2A through FIG. 2E are sectional views showing the sequential steps for manufacturing the conventional bump transfer plate. FIG. 1A is a top view, FIG. 1B is a sectional view, and FIG. 1C is an enlarged view of FIG. 1B.

As shown in FIG. 1A, in a conventional bump transfer plate 121, solder bumps 122 of eutectic solder or high melting point solder are formed on a base 123 made of Al or stainless steel. The solder bumps 122 are arranged to meet the arrangement of electrodes of a semiconductor element to be connected in a later process.

When the bump transfer plate 121 is manufactured, a photo resist layer 124 is first formed on the main surface of the base 123 of FIG. 2A, as shown in FIG. 2B. Thereafter, the photo resist layer 124 is exposed with a mask of a predetermined pattern and developed, thereby forming holes 125, as shown in FIG. 2C, in order to form solder bumps in the later process. Subsequently, the holes 125 are filled with bump formation materials 126 as shown in FIG. 2D, and the photo resist layer 124 is removed as shown in FIG. 2E, thereby forming solder bumps 122. Thus, the bump transfer plate 121 is obtained.

FIG. 3A and FIG. 3B are sectional views showing the sequential steps of a conventional method for manufacturing a semiconductor device, and FIG. 4A through FIG. 4D are sectional views showing the manufacturing method of FIGS. 3A and 3B in detail.

When a semiconductor device is manufactured by the use of the bump transfer plate 121 manufactured as mentioned above, the bump transfer plate 121 is first disposed on a table 17 such that the surface on which the solder bumps 122 are disposed faces a surface on which electrodes 7 of a semiconductor element 1 are disposed, as shown in FIG. 3A and FIG. 4A. An insulating film 3 made of polyimide or the like is formed around the electrodes 7 of the semiconductor element 1. However, the insulating film 3 is not formed on the electrodes 7. Therefore, concave-shaped structures are formed by the insulating film 3 and the electrodes 7. That is, the insulating film 3 and the electrodes 7 form concave portions 8.

The electrodes 7 are then adjusted to coincide with the positions of the solder bumps 122 and is brought into contact therewith as shown in FIG. 3B and FIG. 4B. Thereafter, as shown in FIG. 4C, the solder bumps 122 are transferred onto the electrodes 7 by the reflow of the solder bumps 122, and the base 123 is removed as shown in FIG. 4D.

Another method of forming bumps on a semiconductor element according to the transfer method is disclosed in Japanese Laid-open Patent Publication No. Hei 9-148330. FIG. 5A through FIG. 5H are sectional views showing the sequential steps of the manufacturing method of this publication.

In the method disclosed in the publication, a resist layer 144 is first formed on a base 143 by means of a spin coater, as shown in FIG. 5A, and then holes 145 are formed in the resist layer 144, so that a bump transfer plate 141 is formed. Thereafter, a bump formation materials 142a are formed on the base 143 by metal plating, as shown in FIG. 5B, and the bump formation materials 142a are melted by reflow. If the wettability of the bump formation materials 142a and the base 143 is low at this time, the molten bump formation materials 142a are shaped almost spherical as shown in FIG. 5C. Thereafter, electrodes 7 of a semiconductor element 1 are adjusted to coincide with the positions of the bump formation materials 142a in a state in which the bump formation materials 142a are melted, as shown in FIG. 5D. The bump formation materials 142a and the electrodes 7 are then bonded together as shown in FIG. 5E, and solder bumps 142b are obtained.

After the solder bumps 142b are formed, the base 143 is removed as shown in FIG. 5F, and a metallic plate 146 is pressed against the solder bumps 142b. As a result, the surfaces of the solder bumps 142b are flattened as shown in FIG. 5G, in other words, the solder bumps 142b undergoes coining, and a flat part 142c is formed for each of the solder bumps. Thereafter, the solder bumps 142b are bonded to lands 5 of a package substrate 2 as shown in FIG. 5H.

However, the following problems reside in the bump transfer plates and the semiconductor devices.

In general, the concave portions 8 are formed on the surface of the semiconductor element 1 as shown in FIG. 4A and FIG. 5D. Therefore, when the solder bumps 122 are transferred to the electrodes 7 of the semiconductor element 1 by using the bump transfer plate 121 shown in FIG. 1, gaps 120 are generated in the concave portions 8, as shown in FIG. 4B, in transferring the solder bumps 122 to the electrodes 7 if the tops of the solder bumps 122 are flat. Therefore, voids 127 exist, as shown in FIG. 4D, in the solder bump 122 obtained after the transfer, because of air remaining in the gaps 120. The strength of a junction between the solder bump 122 and the electrode 7 is weakened if the void 127 thus exists in the solder bump 122. Additionally, in a heat treatment process or the like required in, for example, a process of mounting the semiconductor element 1 and the package substrate 2, the possibility that the void 127 expands, and breakage is caused in the junction will increase. As a result, there is a problem in that yield decreases, and productivity decreases.

Especially, in the conventional method of manufacturing the bump transfer plate disclosed in Japanese Laid-open Patent Publication No. Hei 9-148330, the bump formation material 142a is bonded to the electrode 7 while being melted, as mentioned above. At this time, the bump formation material 142a is bonded to the electrode 7, in most cases, in a state in which the material 142a is shaped almost spherical because of melting. It is, however, difficult to cause the molten bump formation material 142a to coincide with the position of the electrode 7 of the semiconductor element 1 so as to form the solder bump 142b. Even if it is possible, another special manufacturing device must be newly used. If another manufacturing device is used, the labor required for the manufacturing process increases, and, at the same time, manufacturing costs increase, thus causing a sudden rise in product costs.

In addition, the resist layer 144 on the base 143 is made of, for example, a photosensitive polyimide film, and is formed with a spin coater. When the resist layer 144 is formed with the spin coater, the thickness of the resist layer 144 to be formed is about 20–30 $\mu$m. On the other hand, with the recent miniaturization of a semiconductor device, so-called solder bump pitch narrowing (i.e., narrowing the distance (pitch) between adjoining solder bumps) has advanced. However, even if the pitch between the solder bumps 142b to be transferred to the semiconductor element 1 is narrowed by the use of the bump transfer plate 141, it is difficult to increase the thickness of the resist layer 144 more than the thickness (about 30 $\mu$m) mentioned above because of the spin coater method. Therefore, the adjoining bumps cannot be divided sufficiently, and are connected to each other when the solder bumps are formed and transferred. As a result, work yields decrease in the formation and the transfer of the solder bumps by plating.

Additionally, after the solder bump 142b is formed on the electrode 7, it is bonded to the package substrate 2. At this time, the solder bump 142b is bonded to the land 5 disposed on the package substrate 2, as mentioned above, and the solder bump 142b undergoes coining in accordance with the kind of package substrate to be bonded or the size of the land 5. This is a step to reliably bond the surface of the solder bump 142b and the package substrate 2 together. The labor required in the manufacturing process depending on this step is also increased.

Additionally, with the recent miniaturization of the semiconductor devices, there is a tendency for the bump diameter also to become smaller. Therefore, there is another problem in that it is difficult to control the thickness of a minute bump during the coining.

SUMMARY OF THE INVENTION

It is an object of the present invention to provide a bump transfer plate and a manufacturing method thereof in which the productivity of a semiconductor device can be improved, and provide a semiconductor device a manufacturing method thereof that have high yields and high productivity.

According to one aspect of the present invention, a bump transfer plate comprises a base and a solder bump formed on the base. A top portion of the solder bump inclines from a central part thereof to a peripheral part thereof.

According to the bump transfer plate, since the solder bump is formed on the base, and the top portion of the solder bump inclines from the central part thereof to the peripheral part thereof, an electrode and the solder bump can be bonded together without generating any gap between the electrode and the solder bump when the solder bump is transferred to the electrode provided on the semiconductor element or the package substrate by the use of the bump transfer plate. Accordingly, the generation of voids is reduced, and the solder bump is prevented from breaking because of the expansion of the voids in the later process, which has conventionally occurred. As a result, productivity is improved and, at the same time, the nonuniformity in size of the solder bumps can be restrained which is caused by the voids.

In addition, since a contact surface of the solder bump with the base is made flat, the top portion of the solder bump is not required to undergo coining before the solder bump is bonded to another substrate, for example. Therefore, the labor required for manufacturing can be reduced.

If the base is made of aluminum, the solder bump easily peels off the base when the solder bump is transferred to the electrode because an oxide film is easily formed when the surface thereof comes in contact with air. As a result, the working efficiency of the transfer is improved.

If the base is made of stainless steel, the solder bump easily peels off the base when the solder bump is transferred because an oxide film is formed on the surface thereof. Therefore, since there is no need to newly form an oxide film for easily peeling the solder bump, the working efficiency of the transfer is improved.

According to another aspect of the present invention, a first method of manufacturing a bump transfer plate includes a step of forming a photo resist layer on a base. The photo resist layer has a hole at a region where a solder bump is intended to be formed. The method further includes steps of stacking a bump formation material into the hole and on the photo resist layer and removing the photo resist layer to form a solder bump.

A second method of manufacturing a bump transfer plate includes a step of forming a photo resist layer on a base. The photo resist layer has a hole at a region where a solder bump is intended to be formed. The method further includes steps of stacking a bump formation material into the hole and on the photo resist layer, applying flux onto a surface of the bump formation material, heating said bump formation material and said flux, and removing the flux to form a solder bump.

According to these manufacturing methods, there can be easily obtained a solder bump that is shaped to incline from the center thereof to the periphery thereof and whose top portion is rounded.

A third method of manufacturing a bump transfer plate includes a step of burying a solder paste in a hollow formed in a bump formation substrate. The deepest part of the hollow is rounded. The method further includes steps of overlapping a base on a surface of said bump formation substrate where said hollow is formed, and heating said solder paste and said base to form a solder bump.

According to this manufacturing method, there can be easily obtained a solder bump that is shaped to incline from the center thereof to the periphery thereof and whose top portion is rounded. In addition, a solder bump can be easily obtained that is variously shaped for various uses by adjusting the shape of the hollow.

According to another aspect of the present invention, a first method of manufacturing a semiconductor device includes a step of bonding an electrode provided to a semiconductor element and the solder bump together subsequent to the steps of one of the aforementioned bump transfer plate manufacturing methods.

According to the manufacturing method, the electrode and the solder bump can be bonded together without generating any gap between the electrode and the solder bump when the solder bump is transferred to the electrode. Accordingly, the generation of voids is reduced, and the solder bump is prevented from breaking due to expansion of the voids caused by heat treatment in the later process. As a result, productivity is improved and, at the same time, fluctuation in size of the solder bumps can be restrained which is caused by the voids. In addition, if a contact surface of the solder bump with the base is made flat, the top portion of the solder bump is not required to undergo coining before the solder bump is bonded to another substrate or the like. Therefore, the labor required for manufacturing can be reduced.

According to another aspect of the present invention, a second method of manufacturing a semiconductor device includes a step of bonding an electrode provided to a package substrate and the solder bump together subsequent to the steps of one of the aforementioned bump transfer plate manufacturing methods.

According to the manufacturing method, the electrode and the solder bump can be bonded together without generating any gap between the electrode and the solder bump when the solder bump is transferred to the electrode. Accordingly, the generation of voids is reduced, and the solder bump is prevented from breaking due to expansion of the voids caused by heat treatment in the later process. As a result, productivity is improved and, at the same time, fluctuation in size of the solder bumps can be restrained which is caused by the voids.

According to another aspect of the present invention, a semiconductor device is manufactured by one of the aforementioned methods. The ratio of voids existing in the solder bump is 10% or less per unit sectional area of said solder bump.

If the ratio of voids existing in a solder bump exceeds 30% of the unit sectional area of the solder bump, the strength of the junction between the solder bump and an electrode decreases. Additionally, the possibility will increase that the voids expand and the junction is broken in heat treatment during the manufacturing process. Therefore, yields might decrease when the void ratio exceeds 30%.

In contrast, in the semiconductor device according to the present invention, the ratio of voids existing in the solder bump is 10% or less of the unit sectional area of the solder bump, and therefore the junction between the solder bump and the electrode is prevented from cracking or breaking due to expansion of the voids. Therefore, the yield is high, and the reliability is also high.

BRIEF DESCRIPTION OF THE DRAWINGS

The foregoing and other features and advantages of the present invention will become more readily more appreciated as the same becomes better understood by reference to the following detailed description when taken into conjunction with the accompanying drawings wherein:

FIG. 11A is a top view, FIG. 11B is a sectional view along line A—A of FIG. 11A, and FIG. 11C is an enlarged view of FIG. 11B.

DETAILED DESCRIPTION OF THE PREFERRED EMBODIMENTS

Figure 6A:
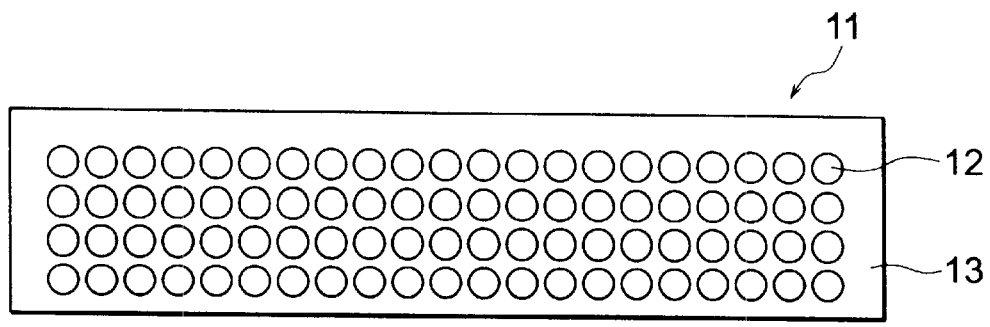
FIG. 6A through FIG. 6C show a bump transfer plate according to a first embodiment of the present invention.
Figure 6B:
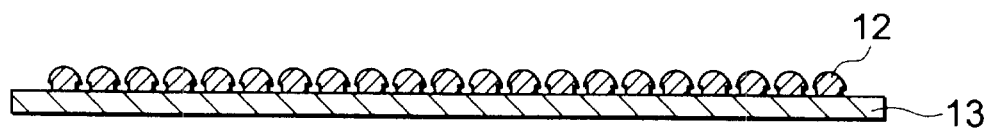
Figure 6C:
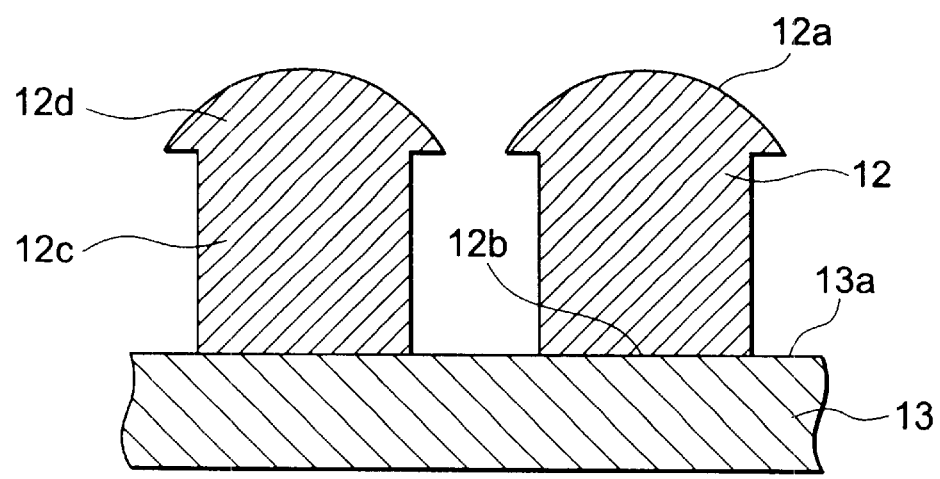

A detailed description will be provided hereinafter of a bump transfer plate, a manufacturing method thereof, a semiconductor device, and a manufacturing method thereof according to the embodiments of the present invention, with reference to the attached drawings. FIG. 6A through FIG. 6C show a bump transfer plate according to a first embodiment of the present invention. FIG. 6A is a top view, FIG. 6B is a sectional view, and FIG. 6C is an enlarged view of FIG. 6B.

In the first embodiment, solder bumps 12 are formed on a base 13. The base 13 is made of a material that does not react to solder, such as aluminum or stainless steel. The solder bump 12 is made of high melting point solder, such as Pb—Sn alloy of eutectic solder or Sn—Pb—Ag alloy of high melting point solder, for example. The material of the base 13 and the solder bump 12 is not limited to these.

The solder bump 12 has a cylindrical portion 12c standing upright on the base 13. A dome portion 12d is formed on the cylindrical portion 12c. The diameter of the cylindrical portion 12c is smaller than that of the dome portion 12d, and the edge of a curved surface 12a of the dome portion 12d projects outward with respect to the side surface of the cylindrical portion 12c.

A main surface 13a of the base 13 on which the cylindrical portion 12c is disposed is flat. Therefore, a contact surface 12b of the cylindrical portion 12c in contact with the main surface 13a is also flat.

A description will be provided of a method of manufacturing a bump transfer plate 11 that has this structure. FIG. 7A through FIG. 7E are sectional views showing the sequential steps of the method of manufacturing the bump transfer plate according to the first embodiment of the present invention.

Figure 7A:
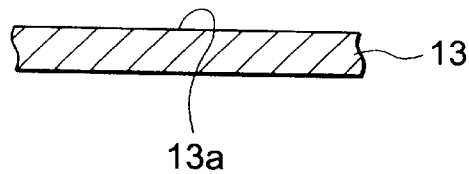
FIG. 7A through FIG. 7E are sectional views showing the sequential steps of a method of manufacturing the bump transfer plate according to the first embodiment of the present invention.
Figure 7D:
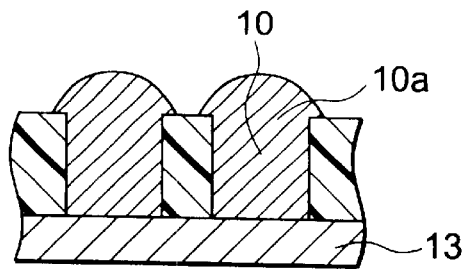
Figure 7B:
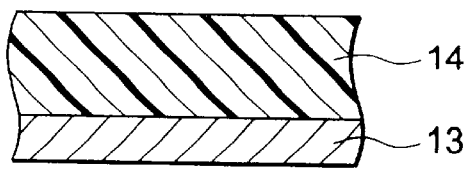

When the bump transfer plate 11 according to the first embodiment is manufactured, a photo resist layer 14 is first formed on the main surface 13a of the base 13 of FIG. 7A, as shown in FIG. 7B.

Figure 7E:
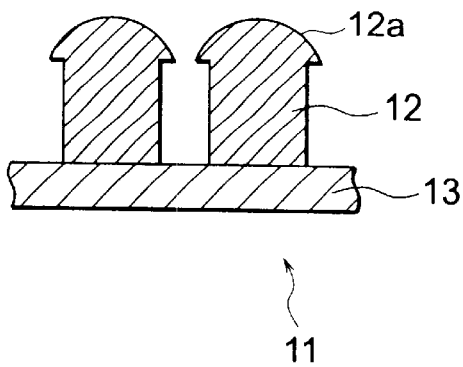
Figure 7C:
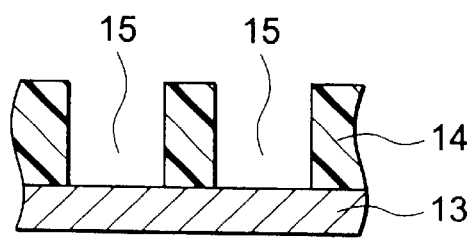

Thereafter, the photo resist layer 14 is exposed by using a mask of a predetermined pattern and developed, and thereby a bump formation material burying portion pattern is formed in the photo resist layer 14 as shown in FIG. 7C. That is, holes 15 to form solder bumps in a later process are made. Herein, the bump formation material burying portion signifies the hole 15 made for burying the bump formation material, and the bump formation material burying portion pattern signifies a pattern that has the holes 15 made in the photo resist layer 14.

Thereafter, as shown in FIG. 7D, the bump formation materials 10, such as solder, are precipitated in the hole 15 and on the photo resist layer 14 according to a plating method. At this time, the bump formation material 10 is precipitated so as to bury the hole 15, and precipitated to such a quantitative extent as not to cover the entire surface of the photo resist layer 14. If the bump formation material 10 is thus formed according to the plating method, a portion 10a higher than the upper face of the photo resist layer 14 of the bump formation material 10 is shaped to flow uniformly to left and right from the center of the hole 15, and the surface thereof is shaped like a bowl.

Thereafter, the photo resist layer 14 is removed, and thereby the solder bumps 12 each of that has a curved surface 12a of the dome portion 12d is formed as shown in FIG. 7E. The dome portion 12d has a curvature. The bump transfer plate 11 is thus obtained according to an easy method.

Figure 8A:
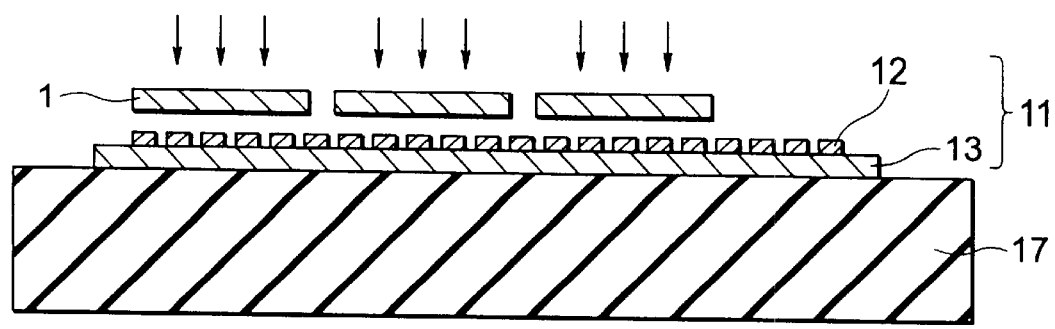
FIG. 8A and FIG. 8B are sectional views showing the sequential steps of a method of manufacturing a semiconductor device that uses the bump transfer plate 11 according to the first embodiment.
Figure 8B:
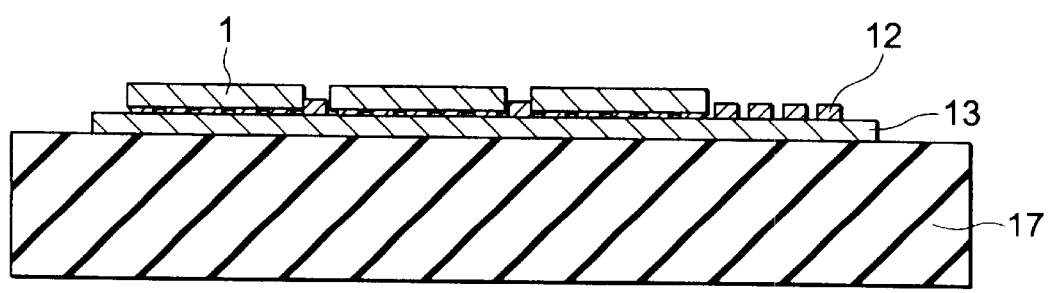

Now, a description will be provided of a method of manufacturing a semiconductor device by using the bump transfer plate 11. FIG. 8A and FIG. 8B are sectional views showing the sequential steps of the manufacturing method of the semiconductor device that uses the bump transfer plate 11 according to the first embodiment. FIG. 9A through FIG. 9D are sectional views showing the manufacturing method of FIGS. 8A and 8B in detail. FIG. 10A and FIG. 10B are sectional views showing the steps subsequent to the steps of FIG. 9A through FIG. 9D.

Figure 9A:
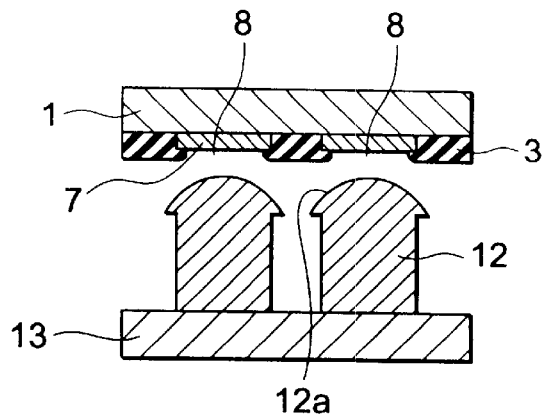
FIG. 9A through FIG. 9D are sectional views showing the manufacturing method of FIGS. 8A and 8B in detail.
Figure 10A:
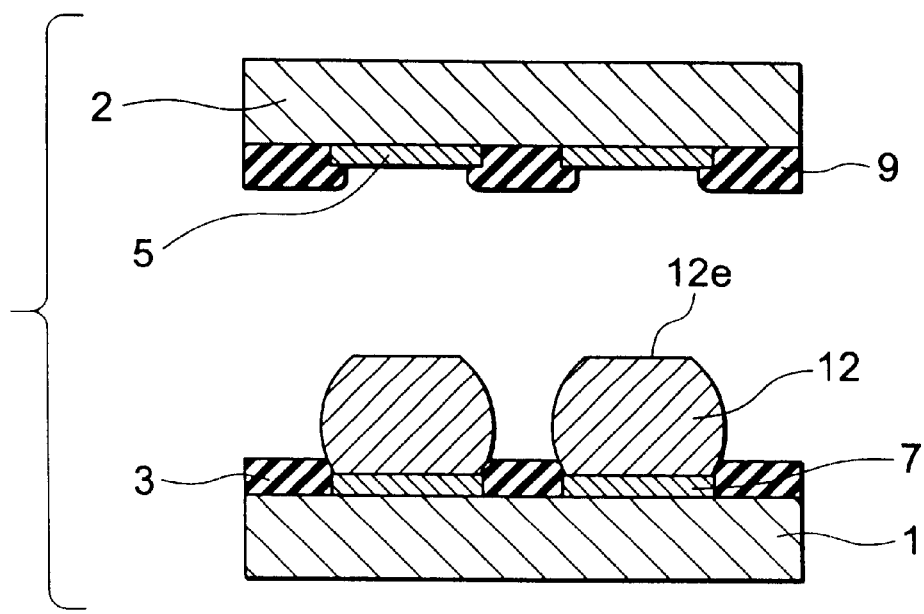
FIG. 10A and FIG. 10B are sectional views showing the steps subsequent to the steps of FIG. 9A through FIG. 9D.
Figure 10B:
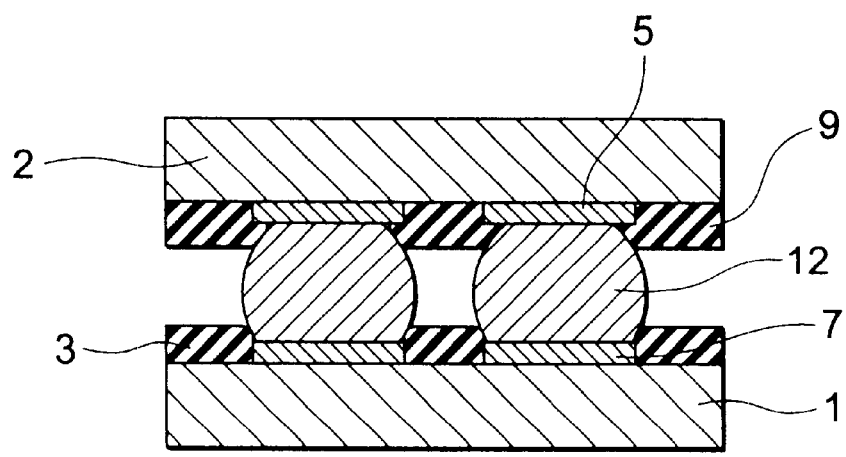

First, as shown in FIG. 8A and FIG. 9A, the surface of the bump transfer plate 11 on which the solder bumps 12 are disposed on a table 17 so as to face the surface of a semiconductor element 1 on which electrodes 7 are formed.

An insulating film 3 made of polyimide or the like is formed around the electrodes 7 of the semiconductor element 1. On the other hand, the insulating film 3 is not formed on the electrodes 7. Therefore, a concave structure is formed by the insulating film 3 and the electrode 7. That is, the insulating film 3 and the electrode 7 form a concave portion 8.

Figure 9B:
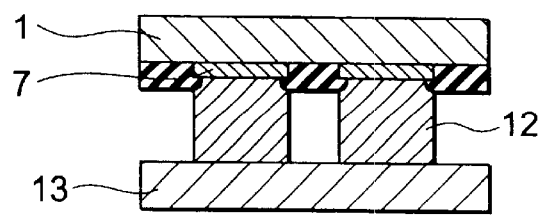

Thereafter, the electrodes 7 are adjusted to coincide with the solder bumps 12 and are pressed thereto as shown in FIG. 8B and FIG. 9B. At this time, the tops of the dome portions 12a of the solder bump 12 are first brought into contact with the electrode 7, and then the solder bumps 12 are crushed.

Figure 9C:
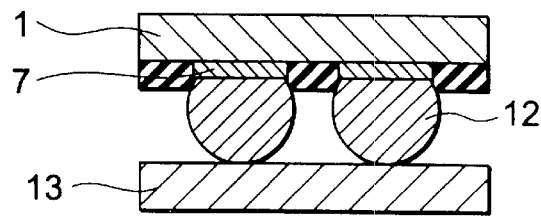

Thereafter, as shown in FIG. 9C, the solder bumps 12 are transferred to the electrodes 7 by the reflow of the solder bumps 12.

Figure 9D:
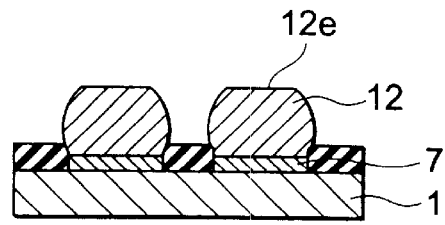

The base 13 is then removed as shown in FIG. 9D.

After the solder bumps 12 are thus transferred to the electrodes 7 of the semiconductor element 1, lands 5 (electrode) disposed on a package substrate 2 are caused to coincide with the solder bumps 12 as shown in FIG. 10A. An insulating film 9 is formed around the lands 5 of the package substrate 2.

Thereafter, a surface opposite to the contact surface of the solder bumps 12 with the electrodes 7 is bonded to lands 5 as shown in FIG. 10B.

If the semiconductor device is thus manufactured by using the bump transfer plate 11 according to the first embodiment, the electrode 7 and the solder bump 12 can be bonded together without any gap even if there exists the concave portion 8 by the insulating film 3 and the electrode 7 formed in the semiconductor element 1 because the dome portion 12d that lowers toward the edge from the center thereof is formed in the solder bump 12. As a result, the generation of voids is reduced, and productivity and yields are improved.

In addition, when the semiconductor device is formed, the contact surface 12b of the solder bump 12 with the base 13 is flat, and the electrode 7 is pressed against the solder bump 12 prior to the reflow, and, therefore, a flat part 12e is formed in the solder bump 12 after the reflow. Therefore, there is no need to beforehand allow the solder bump 12 to undergo coining before the solder bump 12 is bonded to the land 5 of the package substrate 2. Therefore, the labor required for manufacturing can be reduced. In other words, the semiconductor device can be manufactured easily and efficiently.

Figure 11A:
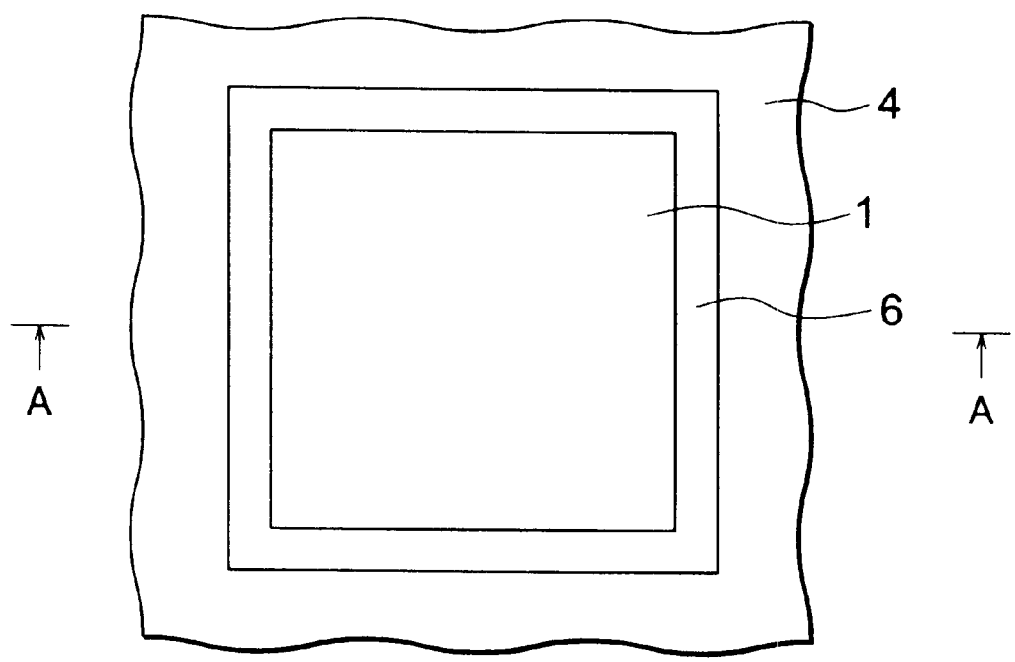
FIG. 11A through FIG. 11C show a semiconductor device manufactured by using the bump transfer plate 11 according to the first embodiment.
Figure 11B:
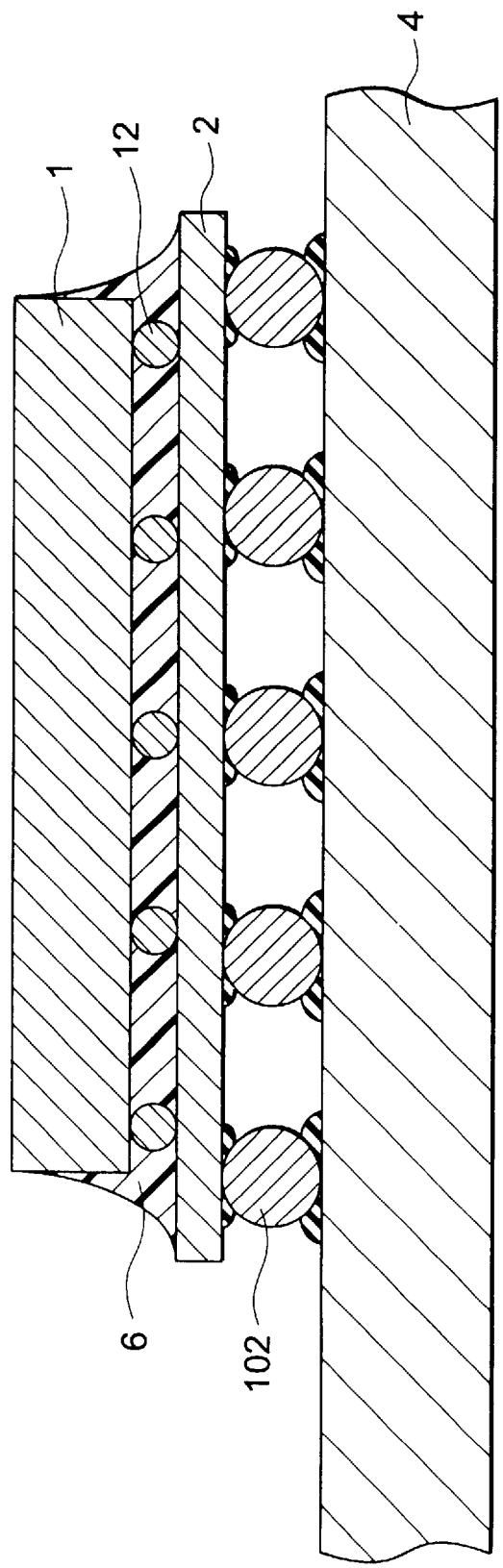
Figure 11C:
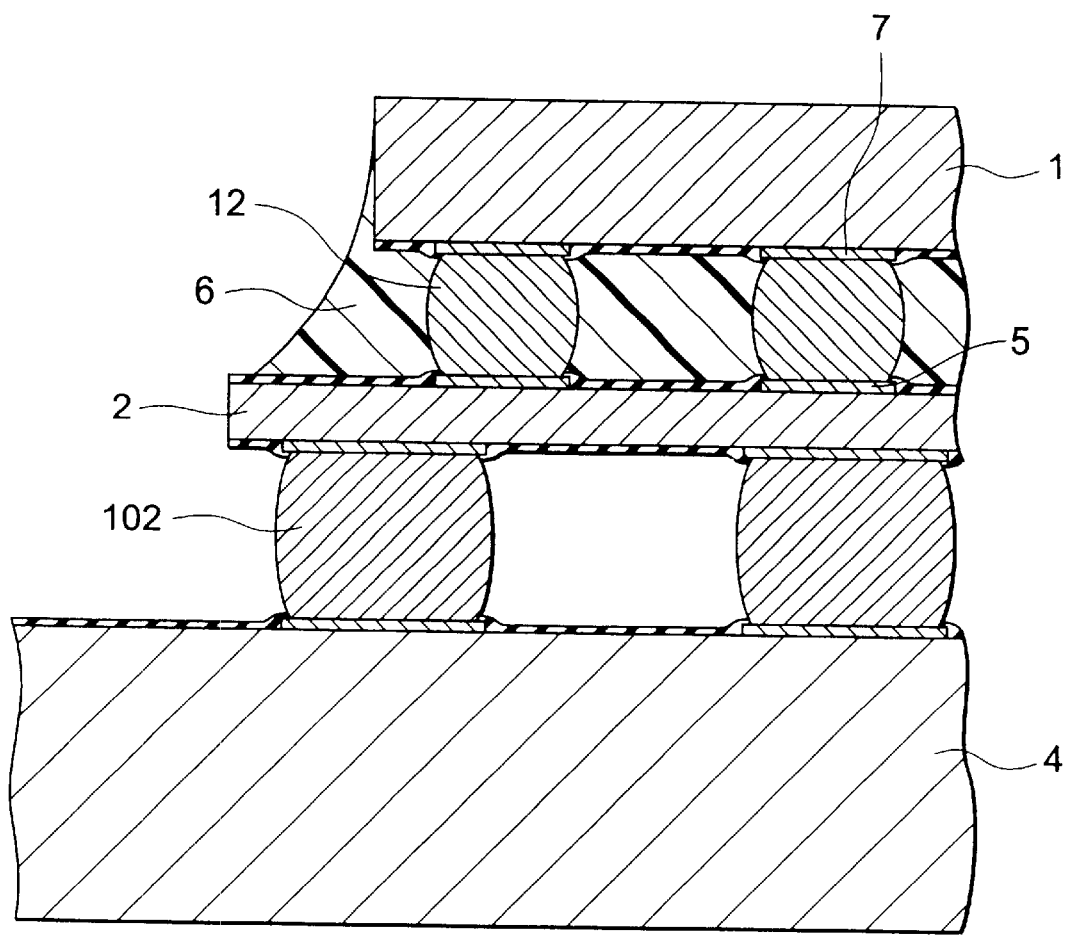

FIG. 11A through FIG. 11C show a semiconductor device manufactured by using the bump transfer plate 11 according to the first embodiment. FIG. 11A is a top view, FIG. 11B is a sectional view along line A—A of FIG. 11A, and FIG. 11C is an enlarged view of FIG. 11B.

Subsequent to the steps mentioned above, the package substrate 2 is bonded to the printed board 4 with the bump 102 therebetween. A sealing resin material 6 is applied between the semiconductor element 1 and the package substrate 2 and around them, for sealing.

In the semiconductor device manufacturing method mentioned above, the solder bump 12 is transferred to the electrode 7. Instead, the solder bumps can be transferred to the lands (electrodes) formed on the package substrate. If so, the lands are adjusted to coincide with the solder bumps 12 formed on the bump transfer plate 11, and the solder bumps 12 are pressed against the electrodes. And, by heat treatment, the solder bumps 12 can be formed on the electrode.

If the base 13 is made of aluminum or aluminum alloy, an oxide film is easily formed on the surface of the base 13 when it comes in contact with air. Therefore, the solder bump 12 easily peels off the base 13 when the solder bump 12 is transferred. Thus, the working efficiency of transfer is high. If the base 13 is made of stainless steel, it is not required to newly form an oxide film for causing the solder bump 12 to easily peel off the base 13 because an oxide film is formed on the surface of the stainless steel normally. Therefore, similarly, the working efficiency of transfer is high.

Figure 12A:
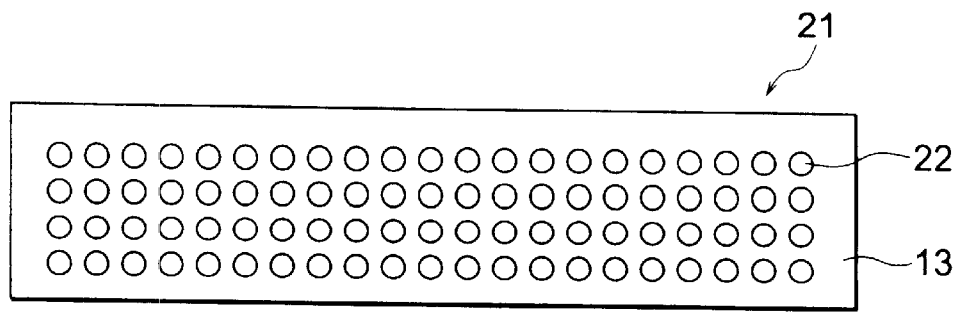
FIG. 12A through FIG. 12C show a bump transfer plate according to a second embodiment of the present invention.
Figure 12B:
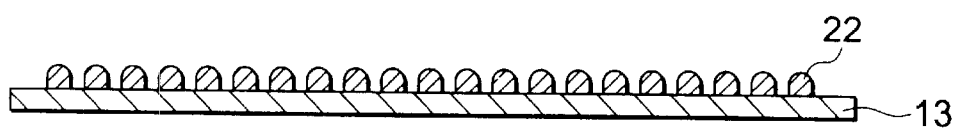
Figure 12C:
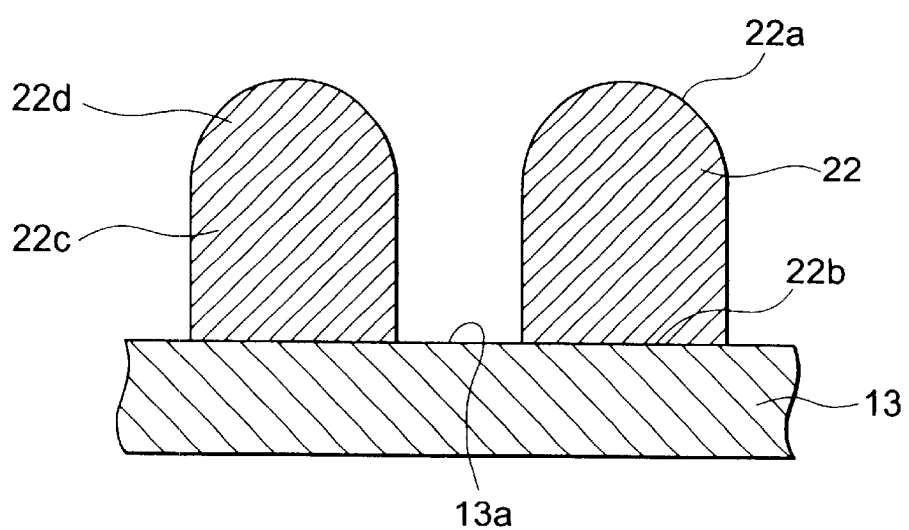

Now, a second embodiment of the present invention will be described. In the second embodiment, the solder bump has a dome portion as in the first embodiment. However, the diameter of the dome portion is the same as that of the cylindrical portion. FIG. 12A through FIG. 12C show a bump transfer plate according to the second embodiment of the present invention. FIG. 12A is a top view, FIG. 12B is a sectional view, and FIG. 12C is an enlarged view of FIG. 12B.

In the second embodiment, the solder bump 22 is formed on the base 13. The solder bump 22 has a cylindrical portion 22c standing upright on the base 13. A dome portion 22d is formed on a cylindrical portion 22c. The diameter of the cylindrical portion 22c is the same as that of the dome portion 22d.

A main surface 13a of the base 13 on which the cylindrical portion 22c is disposed is flat. Therefore, a contact surface 22b of the cylindrical portion 22c with the main surface 13a is also flat.

Next, a description is provided of a method of manufacturing the thus constructed bump transfer plate 21. FIG. 13A through FIG. 13G are sectional views showing the sequential steps of the method of manufacturing the bump transfer plate according to the second embodiment of the present invention.

Figure 13A:
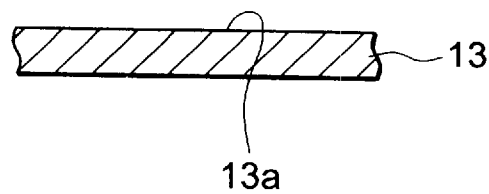
FIG. 13A through FIG. 13G are sectional views showing the sequential steps of a method of manufacturing the bump transfer plate according to the second embodiment of the present invention.
Figure 13B:
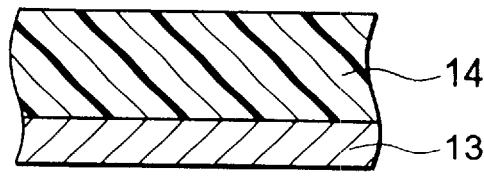

When the bump transfer plate 21 according to the second embodiment is manufactured, a photo resist layer 14 is first formed on the surface 13a of the base 13 of FIG. 13A, as shown in FIG. 13B.

Figure 13C:
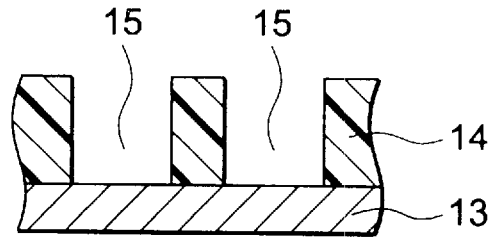

Thereafter, the photo resist layer 14 is exposed by using a mask of a predetermined pattern and developed, and holes 15 for burying a bump formation material in the photo resist layer 14 are formed as shown in FIG. 13C.

Figure 13D:
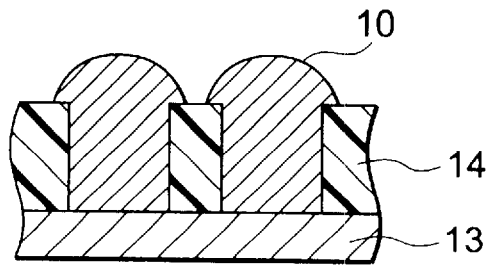

The bump formation materials 10, such as solder, are then precipitated in the holes 15 and on the photo resist layer 14 according to the plating method as shown in FIG. 13D. At this time, the bump formation material 10 is precipitated to fill the hole 15 therewith, and precipitated in such quantities as not to cover the entire surface of the photo resist layer 14.

Figure 13E:
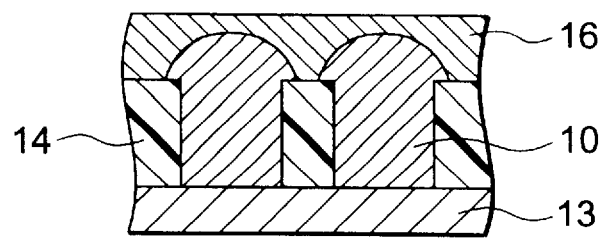

Thereafter, flux 16 is applied to the photo resist layer 14 and the bump formation materials 10 as shown in FIG. 13E.

Figure 13F:
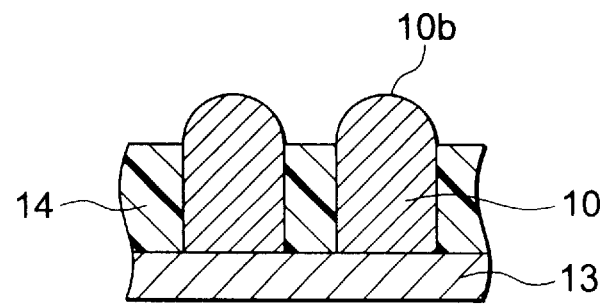

Thereafter, heat treatment is carried out under a predetermined temperature condition, and the base 13 and the like are cooled. As a consequence, the bump formation materials 10 once melt and then solidify with deformation, as shown in FIG. 13F. As a result, a curved surface 10b is formed at the top of the bump formation material 10.

Figure 13G:
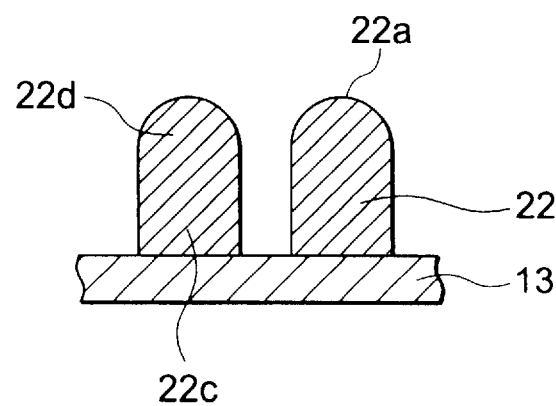

Thereafter, the photo resist layer 14 is removed, and thereby the solder bumps 22 each of that has a curved surface 22a of the dome portion 22d is formed as shown in FIG. 13G. Thus, the bump transfer plate 21 is obtained by an easy method.

Also when a semiconductor device is manufactured by using the thus formed bump transfer plate 21, the generation of voids is reduced, and the manufacturing steps become easy as in the first embodiment.

Figure 14A:
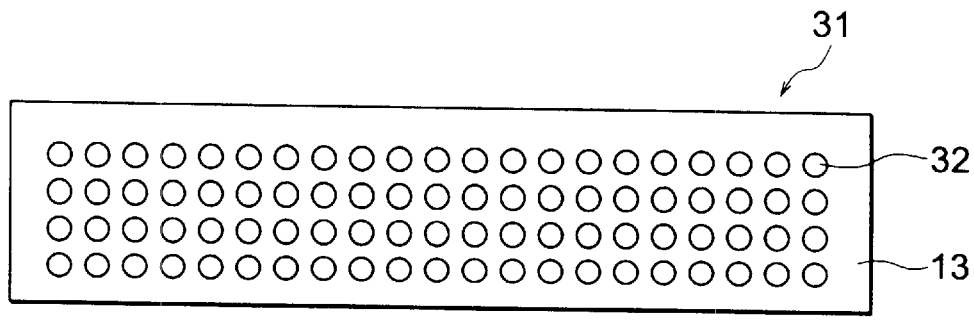
FIG. 14A through FIG. 14C show a bump transfer plate according to a third embodiment of the present invention.
Figure 14B:
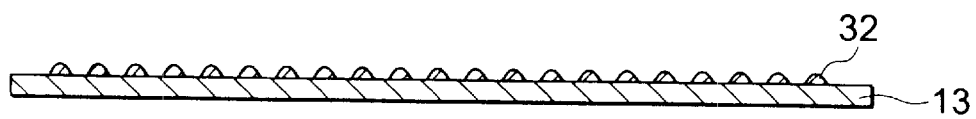
Figure 14C:
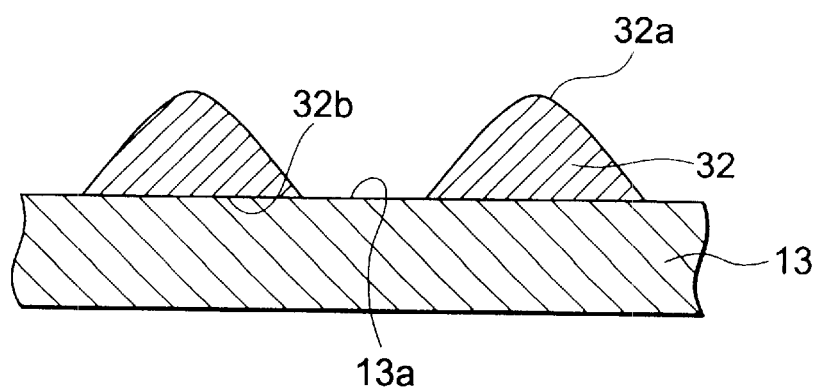

Next, a third embodiment of the present invention will be described. In the third embodiment, a solder bump has a shape like a cone whose top is rounded. FIG. 14A through FIG. 14C show a bump transfer plate according to the third embodiment of the present invention. FIG. 14A is a top view, FIG. 14B is a sectional view, and FIG. 14C is an enlarged view of FIG. 14B.

In the third embodiment, solder bumps 32 are formed on the base 13. The solder bump 32 is shaped like a cone, and the top thereof has a curved portion 32a.

A main surface 13a of the base 13 on which the solder bumps 32 are disposed is flat. Therefore, a contact surface 32b of the solder bump 32 with the main surface 13a is also flat.

Next, a description will be provided of a method of manufacturing the thus constructed bump transfer plate 31. FIG. 15A through FIG. 15D are sectional views showing the sequential steps of the method of manufacturing the bump transfer plate according to the third embodiment of the present invention.

Figure 15A:
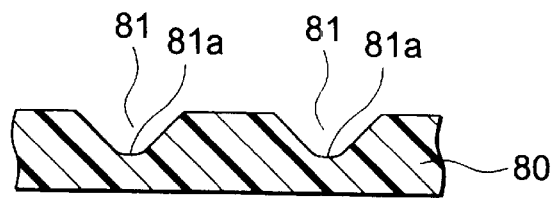
FIG. 15A through FIG. 15D are sectional views showing the sequential steps of a method of manufacturing the bump transfer plate according to the third embodiment of the present invention.

When the bump transfer plate 31 according to the third embodiment is manufactured, hollows 81 shaped like an inverted cone is first formed in a bump formation substrate 80 as shown in FIG. 15A. The bottom of the hollow 81 is rounded like a bowl. The bump formation substrate 80 is made of, for example, ceramics, Teflon (trade mark), or material in which ceramics or Teflon is coated with a TiW film.

Figure 15B:
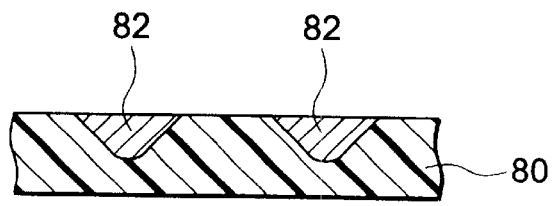

Thereafter, as shown in FIG. 15B, solder paste 82 as a bump formation material is buried in the hollows 81 by means of, for example, printing.

Figure 15C:
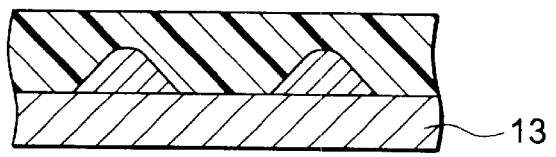

The base 13 is then laid on the surface under which the hollows 81 of the substrate 80 are formed, as shown in FIG. 15C.

Figure 15D:
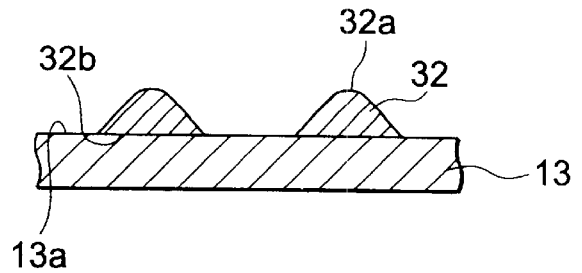

Thereafter, heat treatment is carried out under a predetermined temperature condition, and the base 13 and the solder paste 82 are bonded together. The bump formation substrate 80 is then removed as shown in FIG. 15D. Through these processes, the solder bumps 32 each having the curved portion 32a at the top thereof are formed on the base 13. Thus, the bump transfer plate 31 is obtained by an easy method. A bonded surface 32b of the solder bump 32 with the main surface 13a is flat.

Also when a semiconductor device is manufactured by using the thus constructed bump transfer plate 31, the generation of voids is reduced, and the manufacturing steps become easy as in the first embodiment.

Figure 16A:
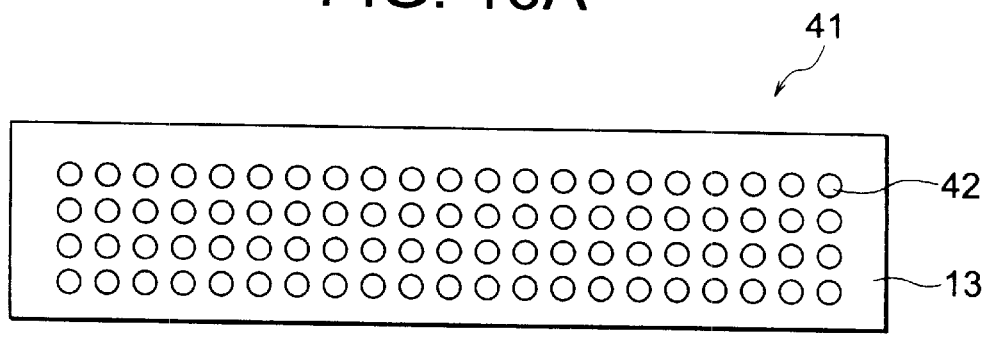
FIG. 16A through FIG. 16C show a bump transfer plate according to a fourth embodiment of the present invention.
Figure 16B:
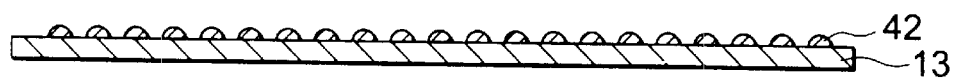
Figure 16C:
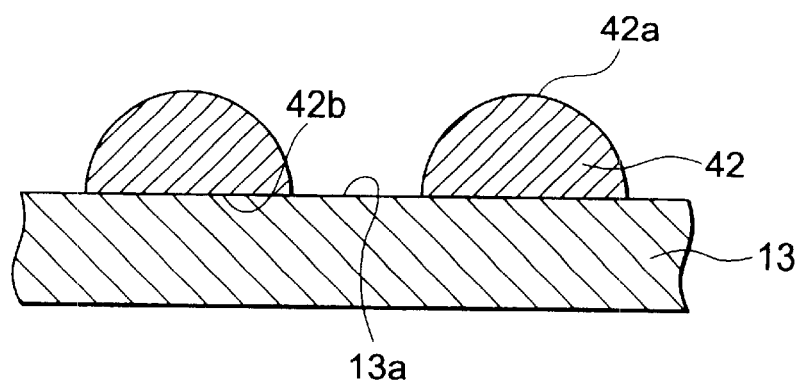

Next, a fourth embodiment of the present invention will be described. FIG. 16A through FIG. 16C show a bump transfer plate according to the fourth embodiment of the present invention. FIG. 16A is a top view, FIG. 16B is a sectional view, and FIG. 16C is an enlarged view of FIG. 16B.

In the fourth embodiment, solder bumps 42 are formed on the base 13. Each of the solder bump 42 has a hemispherical shape, and the surface thereof is a curved portion 42a.

A main surface 13a of the base 13 on which the solder bumps 42 are disposed is flat. Therefore, a contact surface 42b of the solder bump 42 with the main surface 13a is also flat.

When a semiconductor device is manufactured by using the thus constructed bump transfer plate 41, the generation of voids is reduced, and the manufacturing steps become easy as in the first embodiment.

When the bump transfer plate 41 is manufactured, the hollows 81, which are formed in the bump formation substrate 80 used for manufacturing the bump transfer plate 31 in the third embodiment, for example, may be shaped like a hemisphere.

Figure 17A:
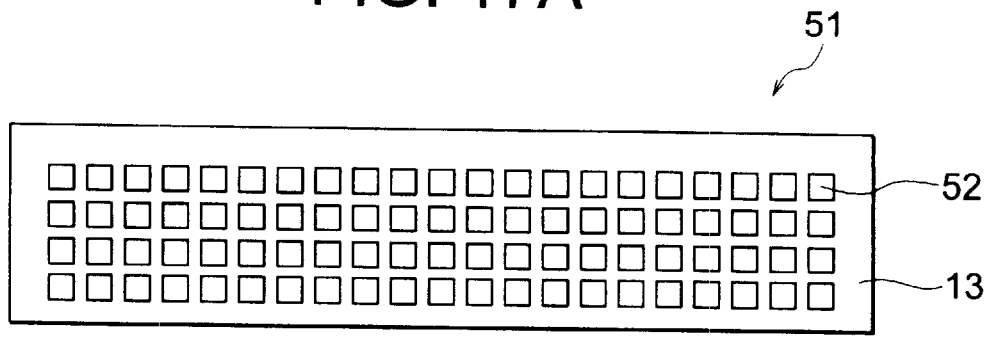
FIG. 17A through FIG. 17C show a bump transfer plate according to a fifth embodiment of the present invention.
Figure 17B:
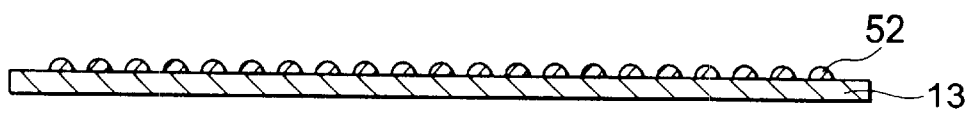
Figure 17C:
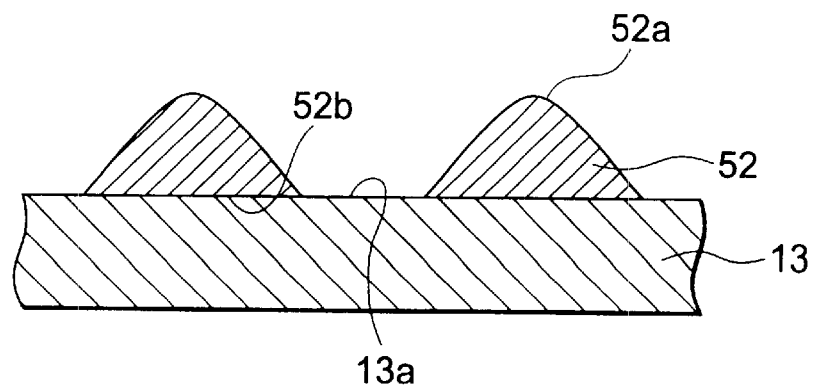

Next, a fifth embodiment of the present invention will be described. FIG. 17A through FIG. 17C show a bump transfer plate according to the fifth embodiment of the present invention. FIG. 17A is a top view, FIG. 17B is a sectional view, and FIG. 17C is an enlarged view of FIG. 17B.

In the fifth embodiment, solder bumps 52 are formed on the base 13. Each of the solder bump 52 is shaped like a regular pyramid, and the top thereof has a curved portion 52a.

A main surface 13a of the base 13 on which the solder bumps 52 are disposed is flat. Therefore, a contact surface 52b of the solder bump 52 with the main surface 13a is also flat.

When a semiconductor device is manufactured by using the thus constructed bump transfer plate 51, the generation of voids is reduced, and the manufacturing steps become easy as in the first embodiment.

When the bump transfer plate 51 is manufactured, the hollows 81, which are formed in the bump formation substrate 80 used for manufacturing the bump transfer plate 31 in the third embodiment, for example, may be shaped like a regular pyramid whose top is rounded.

In general, if the ratio of voids existing in a solder bump exceeds 30% of the unit sectional area of the solder bump, the strength of the junction between the solder bump and an electrode decreases. Additionally, in that situation, the possibility that the voids expand, and the junction is broken increases because of the expansion during heat treatment required for a process of mounting a semiconductor device on a package substrate. Therefore, yields might decrease when the void ratio exceeds 30%.

In contrast, according to the embodiments of the present invention, the ratio of voids existing in the solder bump is less than 30% of the unit sectional area of the solder bump, and therefore the junction between the solder bump and the electrode is prevented from cracking or breaking due to the expansion of the voids.

Preferably, the ratio of the voids in the solder bump is 20% or less per unit sectional area of the solder bump, and more preferably, it is 10% or less.

The present inventor has actually manufactured the solder bump, and photographed it in the form of microphotography. The result is as follows.

Figure 18:
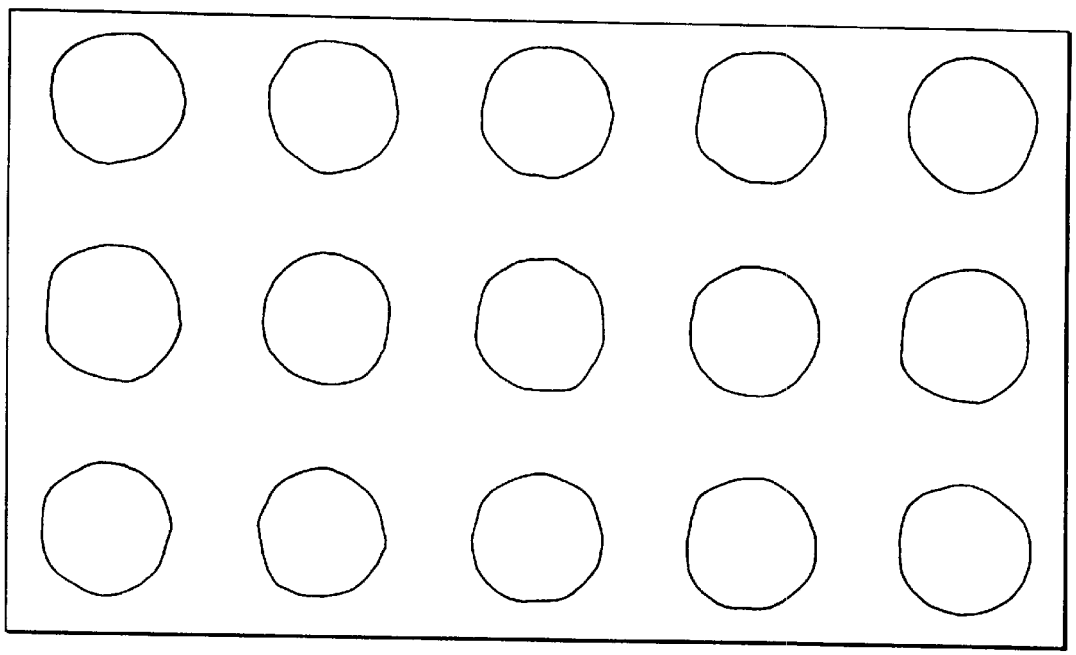
FIG. 18 is a drawing tracing a microphotography of a semiconductor device according to an embodiment of the present invention.

First, a solder bump that has the same shape as in the first embodiment is formed on a base made of stainless steel of 0.1 mm in thickness, and a bump transfer plate is formed. The solder bump is made of Sn—Pb eutectic solder, and the height thereof is 0.13 mm. The pitch of the solder bump is 240 μm. Thereafter, the solder bump is transferred to an electrode disposed on a semiconductor element by the use of the bump transfer plate, and thereby a semiconductor device is manufactured. Thereafter, the solder bump formed on the semiconductor device is photographed with a microscope from above. FIG. 18 is a drawing tracing a microphotograph of the semiconductor device according to the embodiment of the present invention.

Figure 1A:
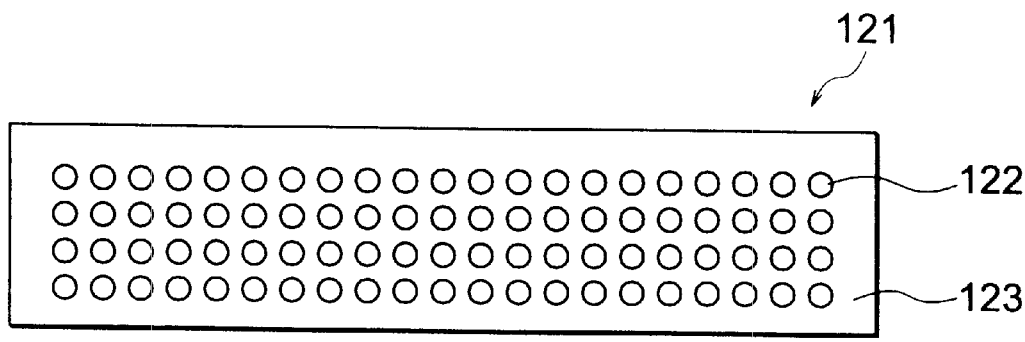
FIG. 1A through FIG. 1C show a bump transfer plate for a conventional transfer method.
Figure 1B:
Figure 1C:
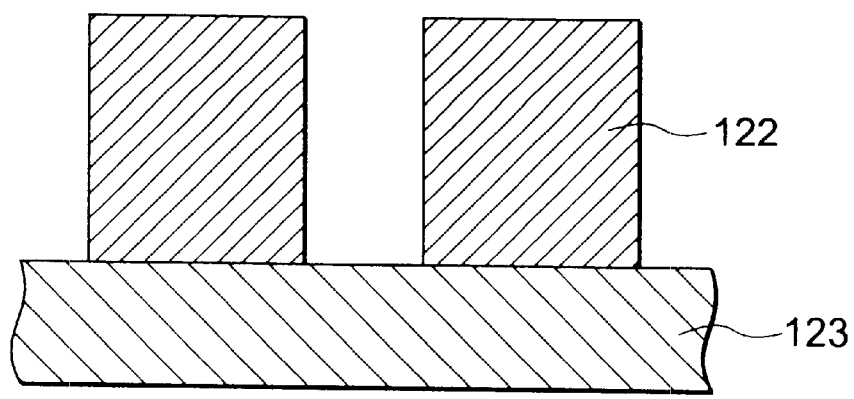
Figure 2A:
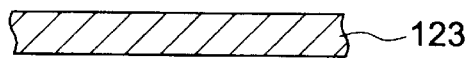
FIG. 2A through FIG. 2E are sectional views showing the sequential steps of a conventional method of manufacturing the bump transfer plate.
Figure 2D:
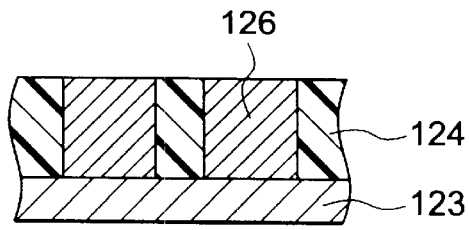
Figure 2B:
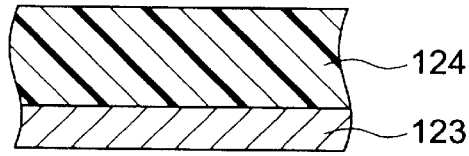
Figure 2E:
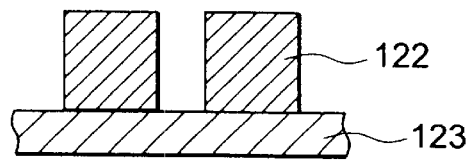
Figure 2E:
Figure 2C:
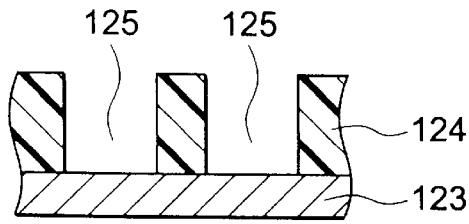
Figure 3A:
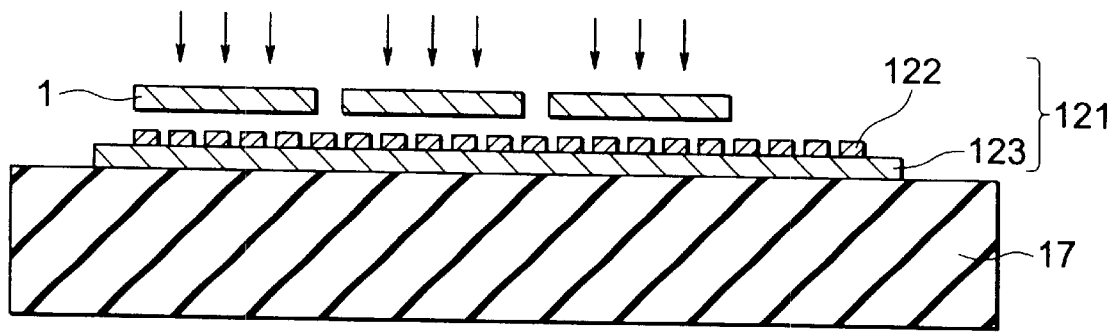
FIG. 3A and FIG. 3B are sectional views showing the sequential steps of a conventional method of manufacturing a semiconductor device.
Figure 3B:
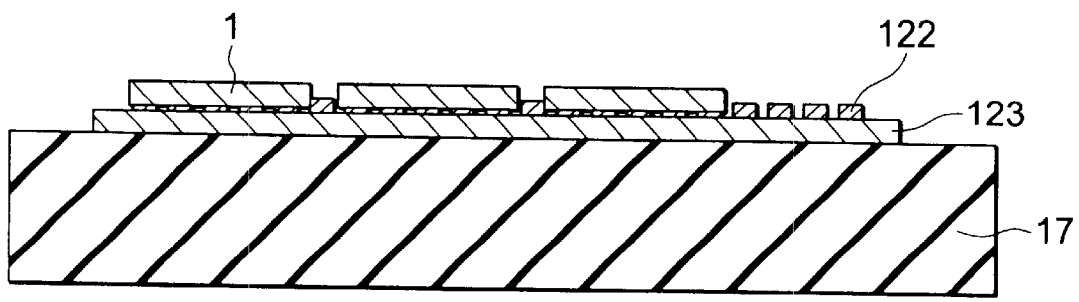
Figure 4A:
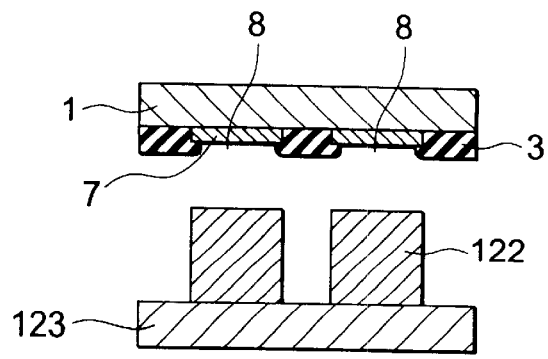
FIG. 4A through FIG. 4D are sectional views showing the manufacturing method of FIGS. 3A and 3B in detail.
Figure 4B:
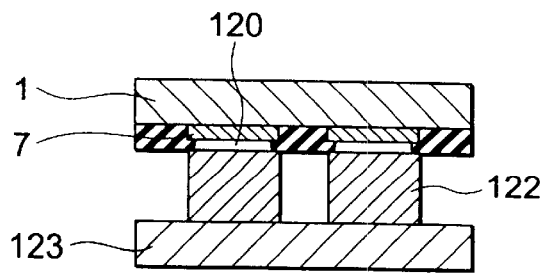
Figure 4C:
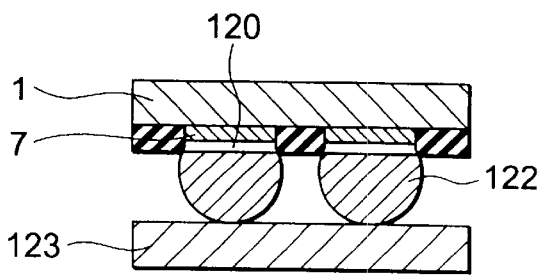
Figure 4D:
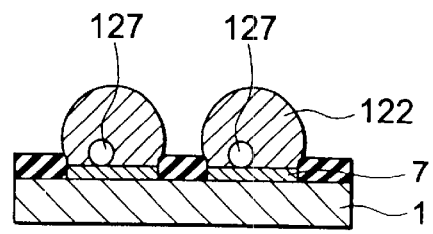
Figure 5A:
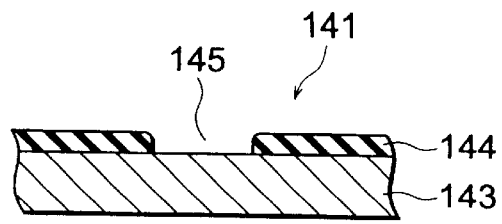
FIG. 5A through FIG. 5H are sectional views showing the sequential steps of a manufacturing method disclosed in Japanese Laid-open Patent Publication No. Hei 9-148330.
Figure 5B:
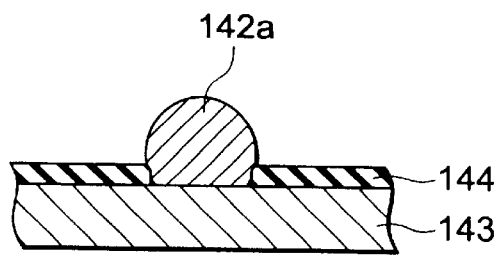
Figure 5C:
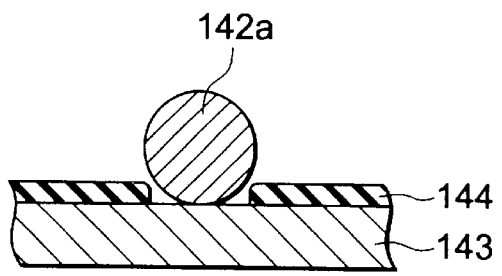
Figure 5D:
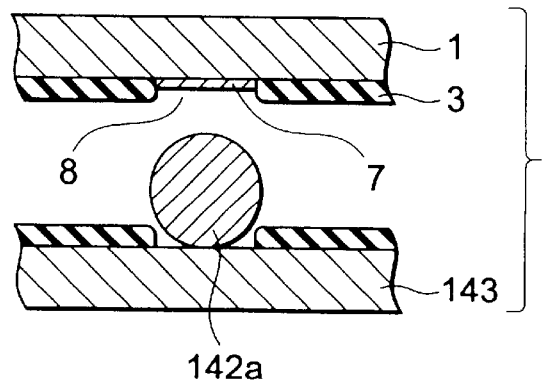
Figure 5E:
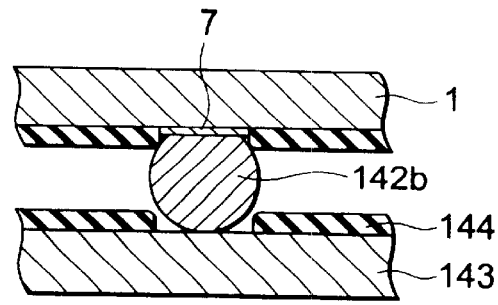
Figure 5F:
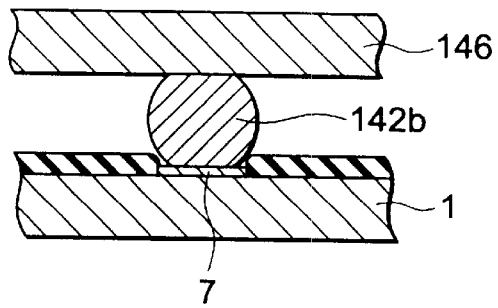
Figure 5G:
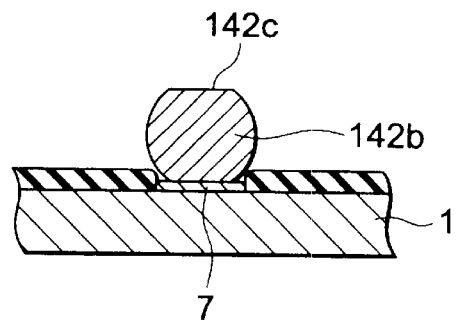
Figure 5H:
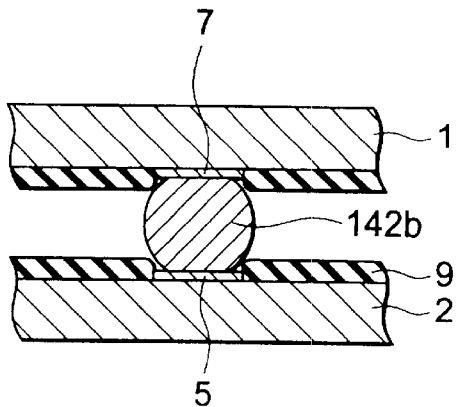
Figure 19:
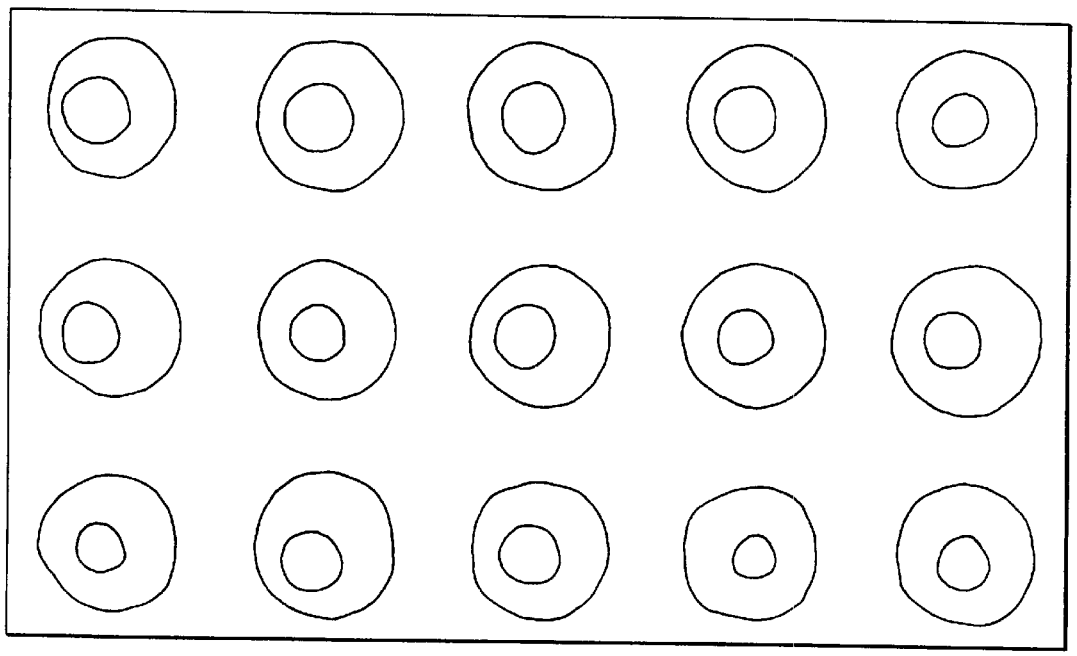
FIG. 19 is a drawing tracing a microphotography of a semiconductor device according to a comparative example.

As a comparative example, a semiconductor device is manufactured in the same way as above, except that the conventional bump transfer plate shown in FIG. 1 is used. The material of the base, the material of the solder bump, the size thereof, and the pitch thereof are similar to the above-mentioned one. Thereafter, the solder bump formed on the semiconductor device is photographed with a microscope from above. FIG. 19 is a drawing tracing a microphotograph of the semiconductor device according to the comparative example.

In the comparative example, it was confirmed that voids were generated in the solder bump as shown in FIG. 19. The ratio of the voids in each solder bump was 20–40% per unit sectional area of each solder bump.

On the other hand, in the semiconductor device according to the present embodiment, voids were hardly generated in the solder bump, and an excellent semiconductor device was obtained as shown in FIG. 18. The ratio of the voids in each solder bump was 10% or less per unit sectional area of each solder bump.

What is claimed is:

1. A method of manufacturing a semiconductor device, comprising the steps of:

forming a photo resist layer on a removable base, said photo resist layer having a hole at a region where a solder bump is intended to be formed;

providing a bump formation material into said hole and on said photo resist layer to form a solder bump in said hole, an end of said solder bump having a dome, said dome extending on the surface of said photo resist layer adjacent to said hole, another end of said solder bump having a flat surface in contact with said removable base;

removing said photo resist layer to expose the surface of said solder bump;

press fitting an electrode provided to a semiconductor element to the end of said solder bump having a dome;

bonding said solder bump to said electrode by transferring by reflow said solder bump to said electrode;

removing said removable base from the end of said solder bump having a flat surface in contact with said removable base, thereby exposing said flat surface.

2. The method of manufacturing a semiconductor device according to claim 1, wherein said removable base is made of stainless steel.

3. A method of manufacturing a semiconductor device, comprising the steps of:

forming a photo resist layer on a removable base, said photo resist layer having a hole at a region where a solder bump is intended to be formed:

providing a bump formation material into said hole and on said photo resist layer to form a solder bump in said hole, an end of said solder bump having a dome, said dome extending on the surface of said photo resist layer adjacent to said hole, another end of said solder bump having a flat surface in contact with said removable base;

removing said photo resist layer to expose the surface of said solder bump;

press fitting an electrode provided to a package substrate to the end of said solder bump having a dome;

bonding said solder bump said to electrode by transferring by reflow said solder bump said to electrode;

removing said removable base from the end of said solder bump having a flat surface in contact with said removable base, thereby exposing said flat surface.

4. The method of manufacturing a semiconductor device according to claim 3, wherein said removable base is made of stainless steel.

* * * * *